United States Patent [19]

Nishioka et al.

[11] Patent Number: 5,286,605
[45] Date of Patent: Feb. 15, 1994

[54] METHOD FOR PRODUCING SOLID-STATE IMAGING DEVICE

[75] Inventors: Yasutaka Nishioka; Hiroshi Kawashima; Shoji Suzuki, all of Itami, Japan

[73] Assignee: Mitsubishi Denki Kabushiki Kaisha, Tokyo, Japan

[21] Appl. No.: 788,378

[22] Filed: Nov. 6, 1991

[30] Foreign Application Priority Data

Nov. 30, 1990 [JP] Japan .................. 2-339355

[51] Int. Cl.$^5$ .............................. G03F 7/26
[52] U.S. Cl. .................... 430/311; 430/314; 430/317; 430/320; 430/321; 430/330; 250/208.1
[58] Field of Search .............. 430/311, 312, 314, 317, 430/318, 329, 321, 330; 250/208.1

[56] References Cited

U.S. PATENT DOCUMENTS 4,694,185 9/1987 Weiss .................. 250/578
4,732,841 3/1988 Radigan .................. 430/311

OTHER PUBLICATIONS

Brunsvold et al, "Advanced Bilayer Resist Process With Optimized PMGI Formulation", SPIE, vol. 1086 Advances in Resist Technology and Processing VI (1989), pp. 289-299.

*Primary Examiner*—Marion E. McCamish
*Assistant Examiner*—Kathleen Duda
*Attorney, Agent, or Firm*—Leydig, Voit & Mayer

[57] ABSTRACT

In a method for producing a micro lens in a solid-state imaging device, a thermally stable transparent resin layer for forming a planar surface is deposited on a base layer of the solid-state imaging device, a far-ultraviolet sensitive thermoplastic layer is deposited on the transparent layer, a photosensitive resin layer sensitive to light of longer wavelength than the far-ultraviolet sensitive resin layer and highly absorbing far-ultraviolet light is deposited on the far-ultraviolet sensitive resin layer, portions of the photosensitive resin layer are removed, far-ultraviolet light irradiates the resin layers, portions of the far-ultraviolet sensitive resin layers are removed, and portions of the transparent layer are thermally deformed into a desired micro lens shape. Therefore, access to the bonding pad under the transparent resin film can be obtained after the deposition and patterning of the thermoplastic resin film wherein non-uniformities in the thermoplastic resin film are reduced, resulting is a micro lens having high light collection ability and no wavelength sensitivity variations.

5 Claims, 5 Drawing Sheets

METHOD FOR PRODUCING SOLID-STATE IMAGING DEVICE

FIELD OF THE INVENTION

The present invention relates to a method for producing a solid-state imaging device having a micro lens on its light receiving surface.

BACKGROUND OF THE INVENTION

FIG. 2 is a plan view showing an arrangement on a pixel unit of a solid-state imaging device. A light-to-electricity conversion part 15 comprising a photodiode, separation parts 16 for separating pixel regions from each other, and a CCD transfer part 17 for transferring light-to-electricity conversion signal generated in the light-to-electricity conversion part 15 are arranged as shown in FIG. 2. A solid-state imaging device includes a plurality of such unit pixels arranged in matrix on a chip. In addition, bonding pads for electrically connecting internal circuits of the chip with external circuits are provided on the chip.

Meanwhile, in order to improve the photosensitivity of a solid-state imaging device, a structure, in which a micro lens is provided on a substrate on which a light-to-electricity conversion element is formed, has been proposed. In this structure, light incident on regions other than on the light-to-electricity conversion element is collected by the micro lens, whereby the effective numerical aperture is improved.

FIG. 3 is a plan view schematically showing a solid-state imaging device having such a micro lens. In FIG. 3, a micro lens 22 is disposed on a light-to-electricity conversion element 21 spreading over and beyond the element 21. A bonding pad 23 is arranged on the periphery of the pixel region. This bonding pad 23 has a square or rectangular shape of a size equivalent to approximately ten pixels.

Although the space between adjacent micro lenses 22 is desired to be short to enhance light collection efficiency, a spacing of 0.5 to 1 micron is usually used considering production to tolerances.

Since the shape of micro lens 22 is optimized according to the shape of pixel, it is not restricted to the oval shape shown in FIG. 3, but may be circular. When the space between adjacent pixels in a longitudinal direction is short, a linear lens 22 as shown in FIG. 4 is employed for collecting light only from a horizontal direction. In this case, light collection efficiency of the micro lens 22 is lower than that of the micro lens shown in FIG. 3, but the production process is simplified. Also in FIG. 4, the space between adjacent micro lenses 22 is about 1 micron.

FIGS. 5(a) to 5(e) are cross-sectional views of process steps for producing the prior art micro lens. In these figures, reference numeral 1 designates a semiconductor substrate. Photodiodes 2 ar disposed in the surface region of substrate 1. Polysilicon gates 3 are disposed on the substrate 1 between the photodiodes 2. A bonding pad 6 is disposed at the periphery of the pixel region in which the photodiodes 2 and the polysilicon gates 3 are formed. An insulating layer 4 is disposed on the photodiodes 2, polysilicon gates 3 and substrate 1. Light shielding films 5 are disposed on the insulating film 4 opposing to the polysilicon gates 3. A base layer 7 of the solid-state imaging device is constituted by the substrate 1, photodiodes 2, polysilicon gates 3, insulating layer 4, light shielding films 5 and bonding pad 6. A flattening resin film 18 is disposed on the base layer 7.

A description is given of the production process.

First of all, a base layer 7 of a solid-state imaging device having light receiving parts 2, charge transfer parts or the like is prepared. Then, as shown in FIG. 5(a), a transparent flattening resin 18, such as thermally hardened resin or ultraviolet light hardened resin, is spin coated on the base layer 7 to a thickness of about 4 to 6 microns. This resin film 18 fills uneven parts of the base layer 7 that adversely affect the shape of micro lens. In addition, the resin film 18 is necessary for lengthening the optical path so that the micro lens may collect light efficiently.

Next shown in FIG. 5(b), a portion of the flattening resin film 18 on the bonding pad 6 is opened using photolithography. Thereafter, as shown in FIG. 5(c), a resin film 19 comprising a transparent material having thermal plasticity is formed on the entire surface to a thickness of about 2 to 3 microns by spin coating or the like. Then, the thermoplastic resin film 19 is partially etched away leaving portions thereof opposing the photodiodes 2, resulting in thermoplastic resin films 19' shown in FIG. 5(d). Finally, the thermoplastic resin films 19' thus patterned are heated up to the softening temperature or higher and deformed into a hemi-spherical shape, resulting in micro lenses 19'' shown in FIG. 5(e). In the solid-state imaging device thus produced, since light incident on the light shielding films 5 can be collected by the micro lenses 19'', the effective numerical aperture is significantly improved, whereby the photosensitivity of the solid-state imaging device is significantly improved.

The prior art method for producing micro lens of solid-state imaging device has the following drawbacks.

First of all, since the thermoplastic resin film serving as the micro lens must be formed of a material transparent to visible light, a material absorbing visible light cannot be used. More specifically, when a material having no photosensitivity is used for the thermoplastic resin film 19, a pattern of photoresist or the like must be formed on the thermoplastic resin film 19 and this pattern must be transferred to the thermoplastic resin film 19 using etching or the like. In this case, since it is difficult to detect the end point of the etching, it is necessary to select a flattening resin film 18 having higher anti-etching property than that of the thermoplastic resin film 19. However, such a flattening resin film 18 makes forming the opening for the bonding pad par difficult.

Meanwhile, it may be thought that a photoresist having sensitive to visible light may be used for the thermoplastic resin film 19 and after performing exposure, development and patterning directly, light irradiates the resin film 19 so that the resin film 19, i.e., micro lens, does not absorb anymore light. However, it is impossible to make the resin film 19 completely transparent. In addition, an extra resist is needed for opening the bonding pad part of the flattening resin film 18 and, therefore, deposition and patterning of the thermoplastic resin film must be carried out after opening the bonding pad part. However, since the difference at the opening is very large, such as 6 to 7 microns, when the thermoplastic resin film 19 is deposited thereon, non-uniformities extend radially from the opening part and influence on the shape of micro lens, resulting in non-uniformity sensitivities which appear on a screen at the time of imaging.

Furthermore, there is an effective method in which a photosensitive material having no visible light absorption, for example, a material which is sensitive to ultraviolet light or far-ultraviolet light, is used as the thermoplastic resin film and exposure and development are directly performed. However, in this method, it is necessary to perform the exposure using an i-line or excimer laser stepper (a reduction-type projection printing apparatus with i line or excimer laser as its light source) with considering the precision of the patterning and superposition on the base layer. This method is difficult to implement because of the cost of the device, producibility, and the like in the current state of semiconductor processing art.

SUMMARY OF THE INVENTION

It is an object of the present invention to provide a method for producing a solid-state imaging device having a high performance micro lens, using a conventional apparatus with no increase in the number of process steps.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a method for producing a solid-state imaging device according to the present invention, in a process of forming a micro lens for collecting light incident on a light-to-electricity conversion element, a thermally stable transparent resin layer for flattening the surface is formed on a base layer on which the light-to-electricity conversion element is formed, an ultraviolet or far-ultraviolet sensitive resin thermoplastic layer is formed on the flattening transparent resin layer, a photosensitive resin layer, which is photosensitive to light of longer wavelength than the ultraviolet or far-ultraviolet sensitive resin layer and highly absorbs ultraviolet and far-ultraviolet rays, is formed on the ultraviolet or far-ultraviolet sensitive resin layer, unnecessary portions of the photosensitive resin layer are removed, ultraviolet or far-ultraviolet light irradiates on the entire surface of the wafer, unnecessary portions of the ultraviolet or far-ultraviolet sensitive resin layer are removed, unnecessary portions of the flattening transparent resin layer are removed, and the ultraviolet or far-ultraviolet sensitive resin layer is deformed into a desired shape of micro lens by thermal treatment. Therefore, the bonding pad part of the flattening transparent resin film can be opened after deposition and patterning of the thermoplastic resin film, whereby plating non-uniformities of the thermoplastic resin film are reduced. As a result, a solid-state imaging device provided with a micro lens having high light collection ability, no unevenness in sensitivity, and no absorption of visible light, can be easily produced.

DETAILED DESCRIPTION OF THE PREFERRED EMBODIMENTS

Figure 1A:
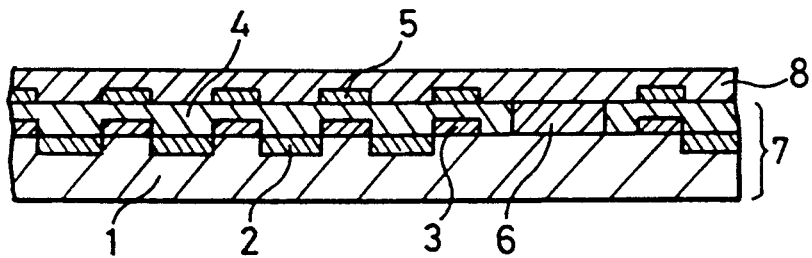
FIG. 1(a) to 1(h) are cross-sectional views of process steps for producing a micro lens of a solid-state imaging device in accordance with a first embodiment of the present invention.

An embodiment of the present invention will be described in detail with reference to the drawings.

FIGS. 1(a) to 1(h) are cross-sectional views in process steps for producing a micro lens of a solid-state imaging device in accordance with an embodiment of the present invention. In FIGS. 1(a) to 1(h), the same reference numerals as those shown in FIGS. 5(a)-5(e) designate the same or corresponding parts.

Figure 1B:
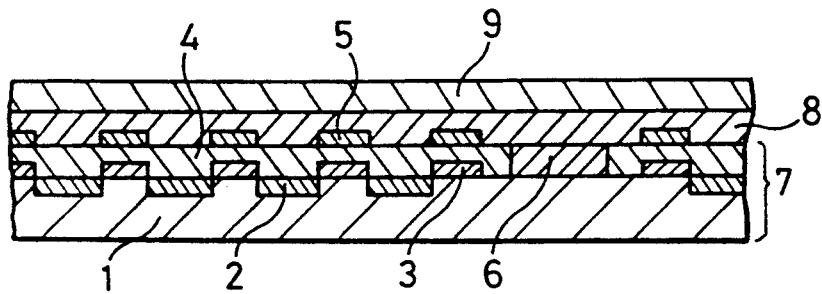
Figure 1C:
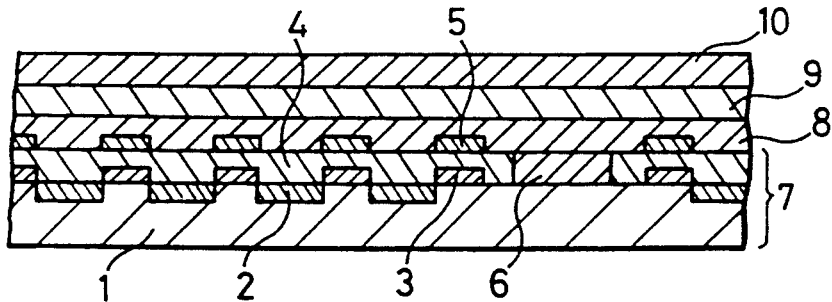
Figure 1D:
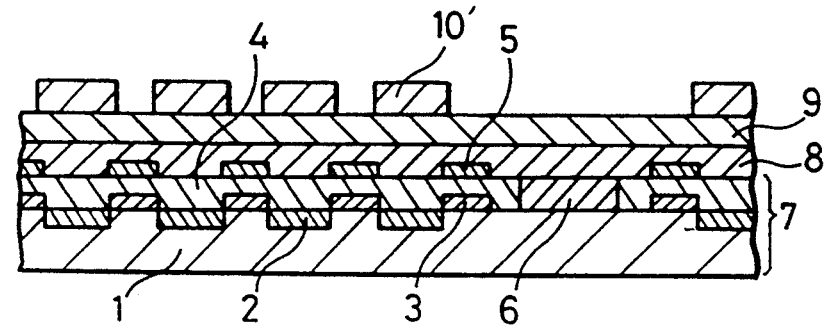
Figure 1E:
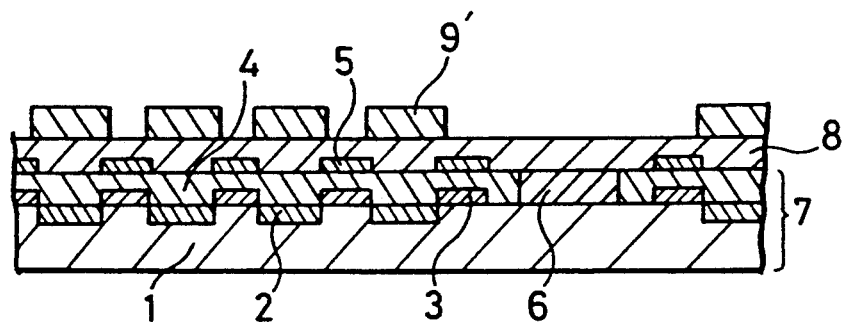

First, a base layer 7 of a solid-state imaging device, which has photodiodes 2, polysilicon gates 3 or the like, is prepared. Then, as shown in FIG. 1(a), a layer 8 comprising a light transmissive thermal stable material (for example, a thermally hardening resin such as Optomer SS series made by Japan Synthetic Rubber Co. Ltd. or a light hardened resin such as FVR series made by Fuji Medical Co. Ltd.) is formed on the base layer 7 to a thickness of 4 to 5 microns by spin coating or the like and then it is hardened by an appropriate method for the material. Then, as shown in FIG. 1(b), a transparent positive photoresist 9 which is sensitive to far-ultraviolet light, such as polymethyl isopropenyl ketone (PMIPK) (for example, ODUR series made by Tokyo Applied Chemistry Industry Co. Let.) is formed thereon to a thickness of about 2 microns by such as spin coating. The, as shown in FIG. 1(c), a novolak system positive photoresist 10 which is sensitive to ordinary visible light (for example, OFPR-800 made by Tokyo Applied Chemistry Industry Co. Ltd. or MCPR-2000H made by Mitsubishi Chemical Synthesis Co. Ltd.) is formed thereon to a thickness of about 2 microns by such as spin coating. If it is assumed that a combination of ODUR including cyclohexanone solvent and MCPR-2000H including ethyl cellosolve acetate solvent is used, since the polymer of ODUR is insoluble in ethyl cellosolve acetate, ODUR is not dissolved when MCPR-2000H is deposited. Then, the positive photoresist 10 is exposed using g-line stepper and developed in aqueous tetramethylammonium hydroxide (a solution with 2% tetramethylammonium hydroxide in water), resulting in a pattern 10' of a micro lens shown in FIG. 1(d). In case of using ODUR, ODUR is not sensitive to g-line light and is stable in aqueous tetramethylammonium hydroxide, so that it is not adversely affected.

Subsequently, the entire surface is irradiated with far-ultraviolet light using a light source such as a super high pressure mercury lamp or a deuterium lamp. At this time, patterned positive photoresist 10' absorbs the far-ultraviolet light and serves as a photomask, so that the far-ultraviolet light sensitive photoresist 9 beneath the photoresist pattern 10' is not exposed to light while the photoresist 9 on which no photoresist 10' exists is exposed to light. Thereafter, the far-ultraviolet light photoresist 9 is developed, resulting in a photoresist pattern 9' which is an accurate transcription of the positive photoresist. In case of using ODUR, since the positive photoresist 10' is dissolved in methyl ethyl ketone, which is a main component of the developing solution, exfoliation of the positive photoresist 10' can be carried out at the same time.

Figure 1F:
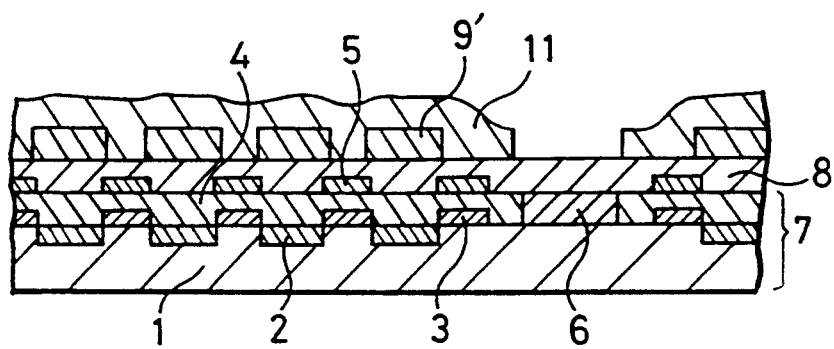
Figure 1G:
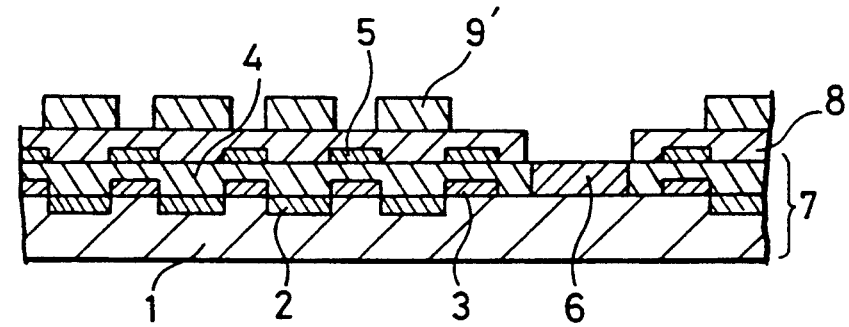

Then, a positive photoresist 11 is deposited on the substrate and patterned by photolithography as shown in FIG. 1(f). Then, using this patterned photoresist 11 as a mask, a portion of the flattening resin film 8 on the bonding pad 6 is opened by such as plasma etching and the patterned photoresist 11 is removed as shown in FIG. 1(g).

Figure 1H:
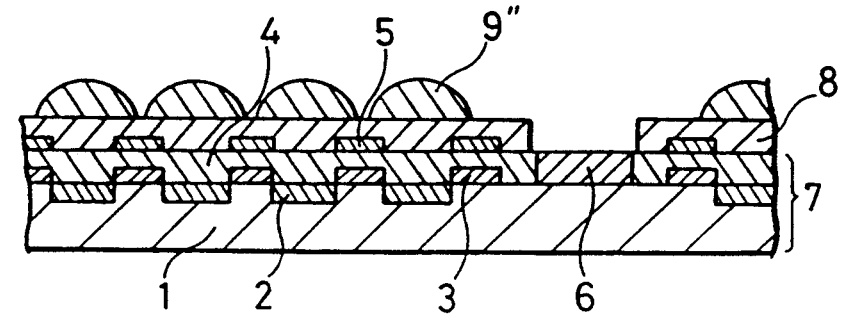
Figure 2:
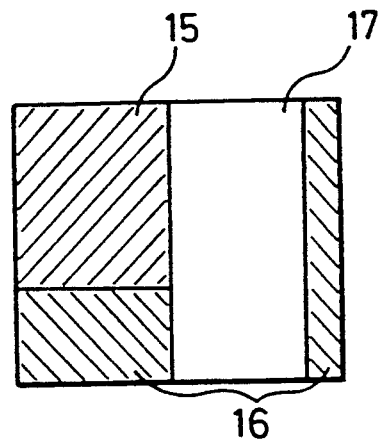
FIG. 2 is a plan view schematically showing an arrangement of a unit pixel of a solid-state imaging device.
Figure 3:
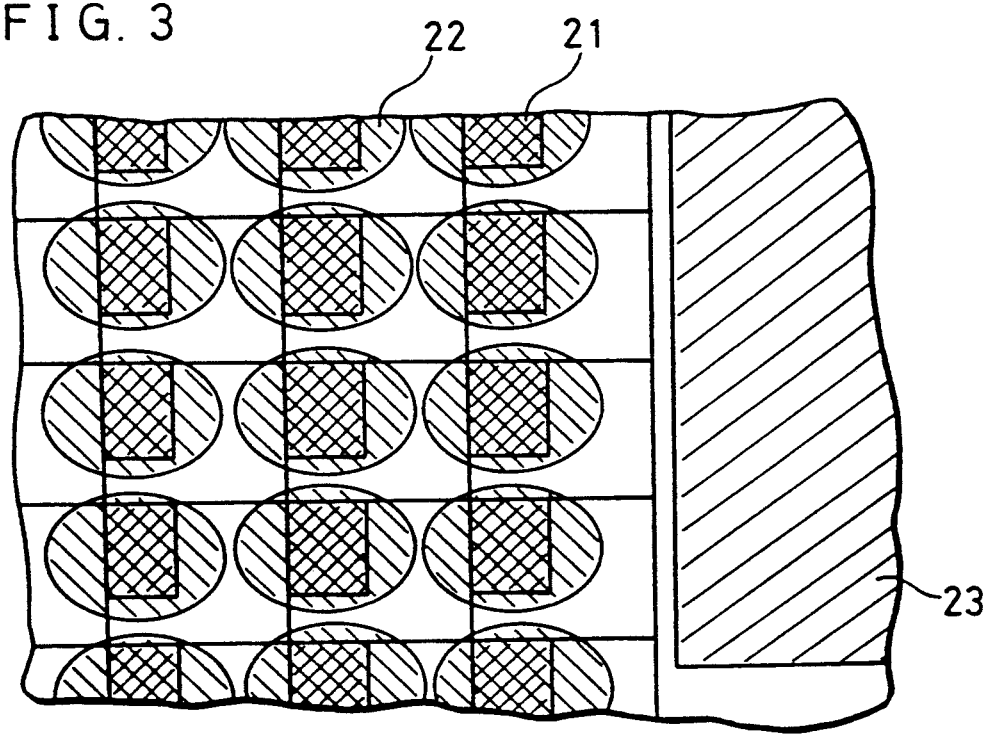
FIG. 3 is a plan view schematically showing a solid-state imaging device provided with micro lens.
Figure 4A:
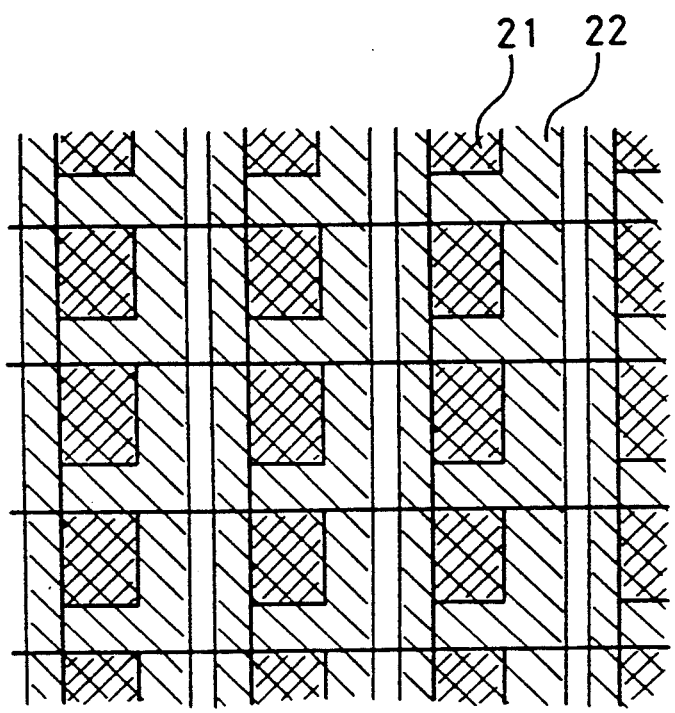
FIG. 4 is a plan view schematically showing another solid-state imaging device provided with micro lens.
Figure 4B:
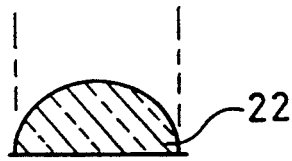
Figure 5A:
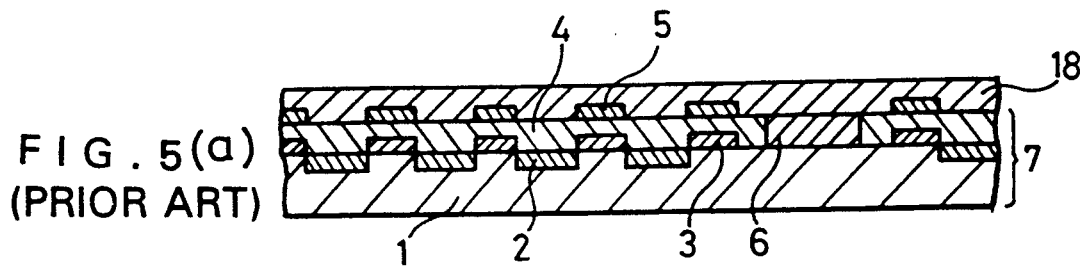
FIGS. 5(a) to 5(e) are cross-sectional views of process steps for producing a micro lens of a solid-state imaging device in accordance with the prior art.
Figure 5B:
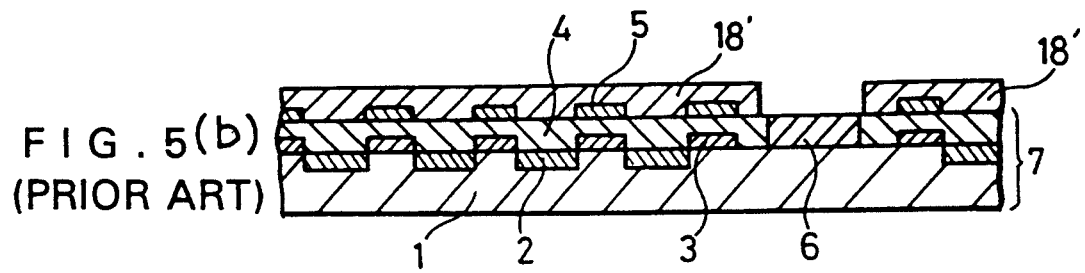
Figure 5C:
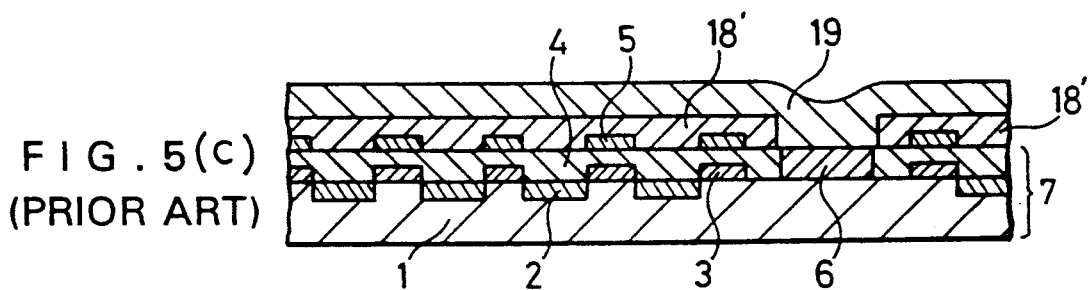
Figure 5D:
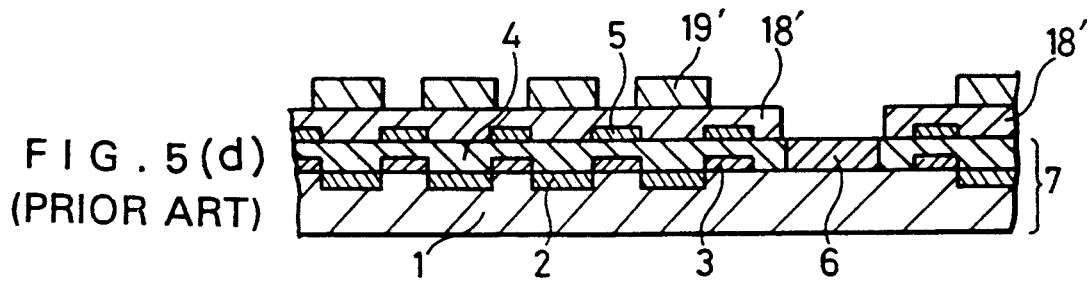
Figure 5E:
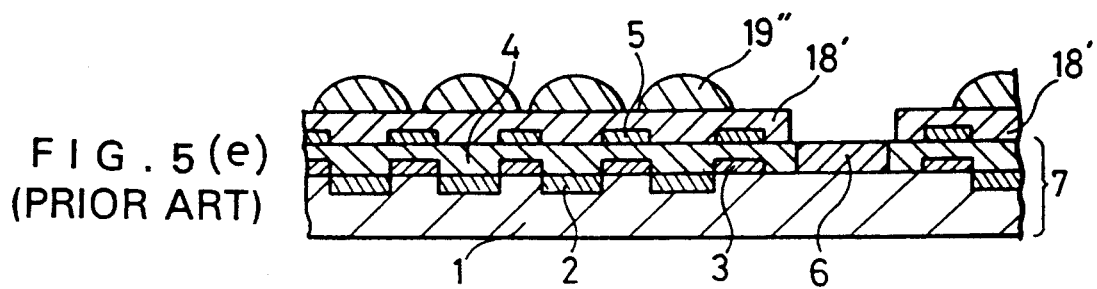

Finally, the substrate is heated up to at least the softening temperature of the thermoplastic resin 9 to thermally soften the patterned thermoplastic resin 9', resulting in semi-spherical micro lenses 9" shown in FIG. 1(h). The temperature and time of heating the substrate depend on the kind of the thermoplastic resin 9 and the required shape of the micro lens. In the case of ODUR, the substrate should be heated at 150 to 160° C. for 15 minutes.

In the above described embodiment of the present invention, the thermally stable transparent resin layer 8 for flattening the surface is formed on the base layer in which the light-to-electricity conversion element is formed, the far-ultraviolet sensitive thermoplastic resin layer 9 is formed on the flattening transparent layer 8, the novolak system positive photoresist 10 is formed on the far-ultraviolet sensitive resin layer 9, unnecessary portions of the photoresist 10 are removed, the entire surface of the wafer is irradiated with far-ultraviolet light to expose the far-ultraviolet sensitive resin layer 9, unnecessary portions of the far-ultraviolet sensitive resin layer 9 are removed by development, the opening for bonding pad is formed through the flattening transparent resin layer 8, and the far-ultraviolet sensitive resin layer 9 is deformed into the shape of a micro lens by thermal treatment. Therefore, the bonding pad part of the flattening resin film 8 is opened after the deposition and patterning of the thermoplastic resin film 9, whereby non-uniformities in the thermoplastic resin film 9 are reduced, resulting in a micro lens having high light collection ability and no unevenness in sensitivity. Furthermore, since the thermoplastic resin film serving as a micro lens is sensitive to far-ultraviolet rays and does not absorb visible light, a sensitive solid-state imaging device having a good spectral-response characteristic over the entire wavelength region of visible light is produced using a conventional production apparatus with no increase in the number of process steps. In addition, the production yield is improved.

In a case where the present invention is applied to a solid-state imaging device which performs color separation using a color filter, the flattening resin film 8 is thinned and a color filter is formed therebelow, or a color filter layer serving also as the flattening resin film 8 is formed.

While in the above embodiment the opening at the bonding pad part is formed prior to the thermal softening of the thermoplastic resin 9', it may be formed after the thermal softening.

The positive photoresist 11 may comprise the same material as that of the positive photoresist 10, although they are used for different purposes.

In addition, the light shielding film 5 may be formed of any material so long as it has low light transmittance. For example, aluminum, tungsten silicide or the like may be used.

In addition, while in the above embodiment a far-ultraviolet sensitive resin is used for the thermoplastic resin film that does not absorb visible light, an ultraviolet sensitive resin or the like may be used so long as it does not absorb light in a desired wavelength region.

As is evident from the foregoing description, according to the present invention, a thermally stable transparent resin layer for flattening the surface is formed on a base layer in which a light-to-electricity conversion element is formed, a thermoplastic ultraviolet or far-ultraviolet sensitive resin layer is formed on the flattening transparent layer, a photosensitive resin layer, which is photosensitive to light of longer wavelength than the ultraviolet or far-ultraviolet sensitive resin layer and highly absorbs ultraviolet or far-ultraviolet rays, is formed on the ultraviolet or far-ultraviolet sensitive resin layer, unnecessary portions of the photosensitive resin layer are removed, ultraviolet or far-ultraviolet rays light irradiates the entire surface of the wafer, unnecessary portions of the ultraviolet or far-ultraviolet sensitive resin layer are removed, unnecessary portions of the flattening transparent layer are removed, and the ultraviolet or far-ultraviolet sensitive resin layer is deformed into the desired micro lens shape thermally. Therefore, access to the bonding pad part under the flattening transparent resin film can be achieved after deposition and patterning of the thermoplastic resin film, whereby deposition non-uniformities of the thermoplastic resin film are reduced, resulting in a micro lens having high light collection and no variation in sensitivity. In addition, since the thermoplastic resin film serving as a micro lens does not absorb visible light, a sensitive solid-state imaging device having good spectral-response characteristics over the entire wavelength visible light range is produced using a conventional production apparatus with no increase in the number of process steps. In addition, the production yield can be improved.

What is claimed is:

1. A method for producing a solid-state imaging device having a light-to-electricity conversion element disposed on a substrate and a micro lens for collecting light incident on the light-to-electricity conversion element comprising:

forming a transparent, thermally stable resin layer on a substrate including a light-to-electricity conversion element to produce a flattened surface;

depositing on the flattened surface of said thermally stable resin layer a first photosensitive thermoplastic resin layer sensitive to light within a range of wavelengths shorter than wavelengths of visible light;

depositing on said first photosensitive thermoplastic rein layer a second photosensitive resin layer that is sensitive to light of longer wavelength than said first photosensitive thermoplastic resin layer and that absorbs the light to which said first photosensitive thermoplastic resin layer is sensitive;

exposing portions of said second photosensitive resin layer with light to which said second photosensitive resin layer is sensitive and developing said second photosensitive resin layer to form a pattern including portions of said second photosensitive resin layer remaining after developing said second photosensitive resin layer;

irradiating said thermally stable, thermoplastic, first, and second resin layers with the light to which said first photosensitive thermoplastic resin layer is sensitive using said pattern as a mask;

removing the portions of said first photosensitive thermoplastic resin layer exposed to light to which said first photosensitive thermoplastic resin layer is sensitive, leaving portions of said first photosensitive thermoplastic resin layer remaining on said transparent, thermally stable resin layer with portions of said transparent, thermally stable resin layer exposed;

depositing a photoresist film on the remaining portions of said first photosensitive thermoplastic resin layer and on the portions of said transparent, thermally stable resin layer that are exposed by the remaining portions of said first photo-sensitive resin layer;

exposing said photoresist film to a pattern of light to which said photoresist film is sensitive and developing said photoresist film to expose a portion of said transparent, thermally stable resin layer;

removing the exposed portion of said transparent, thermally stable resin layer to provide access to part of said substrate;

removing remaining portions of said photoresist film; and thermally deforming the remaining portions of said first photosensitive thermoplastic resin layer into microlenses.

2. A method for producing a solid-state imaging device in accordance with claim 1 wherein said first photosensitive thermoplastic resin layer comprises a positive photoresist and said second photosensitive resin layer comprises a novolak positive photoresist.

3. A method for producing a solid-state imaging device in accordance with claim 2 wherein said first photosensitive thermoplastic resin layer comprises polymethyl isopropenyl ketone.

4. A method for producing a solid-state imaging device in accordance with claim 1 including depositing said transparent, thermally stable resin layer, said first photosensitive thermoplastic resin layer, and said second photosensitive resin layer by spin coating.

5. A method for producing a solid-state imaging device in accordance with claim 1 including removing at least one portion of said transparent, thermally stable resin layer after thermally deforming said first photosensitive thermoplastic resin layer.

* * * * *